(12) United States Patent
Xu et al.

(10) Patent No.: US 11,862,531 B2
(45) Date of Patent: Jan. 2, 2024

(54) POWER DEVICE, POWER DEVICE ASSEMBLY, AND RELATED APPARATUS

(71) Applicant: Huawei Digital Power Technologies Co., Ltd., Guangdong (CN)

(72) Inventors: Yankun Xu, Xi'an (CN); Yue Chen, Xi'an (CN); Yang Zhao, Xi'an (CN); Ruoyang Du, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/668,158

(22) Filed: Feb. 9, 2022

(65) Prior Publication Data

US 2022/0270952 A1 Aug. 25, 2022

(30) Foreign Application Priority Data

Feb. 10, 2021 (CN) .......................... 202110184232.7

(51) Int. Cl.
*H01L 23/40* (2006.01)
*H05K 1/02* (2006.01)

(52) U.S. Cl.
CPC ....... *H01L 23/4006* (2013.01); *H05K 1/0204* (2013.01); *H05K 1/0209* (2013.01); *H01L 2023/405* (2013.01); *H05K 2201/066* (2013.01)

(58) Field of Classification Search
CPC ...... H05K 7/00; H05K 7/1422; H05K 7/2039; H05K 7/2049; H05K 7/20409–20418; H05K 7/20154; H05K 7/20509; H05K 7/209; H05K 1/0201–0203; H05K 1/0204; H05K 1/0209; H05K 2201/66; H01L 23/367; H01L 23/3677; H01L 23/40–4006; H01L 23/4093;
(Continued)

(56) References Cited

U.S. PATENT DOCUMENTS 6,623,178 B1 * 9/2003 Sakurai ................ G02B 6/4232
385/94
7,723,846 B2 * 5/2010 Ikawa ................ H01L 23/49861
361/740
(Continued)

FOREIGN PATENT DOCUMENTS

CN 102790043 A 11/2012
CN 109738773 A 5/2019
(Continued)

*Primary Examiner* — Amir A Jalali
(74) *Attorney, Agent, or Firm* — Paul Hashim

(57) ABSTRACT

This disclosure provides a power device, a power device assembly, and a related apparatus. The power device includes a package body and a plurality of pins. The package body includes a substrate structure, a semiconductor die, and a molded package. The semiconductor die is disposed on the substrate structure. The substrate structure includes a heat dissipation surface connectable to a heat sink. A first end of each pin is connected to the substrate structure. The molded package covers the semiconductor die and the substrate structure excluding the heat dissipation surface. A second end of each pin and the heat dissipation surface are both uncovered from the molded package. The second end of each pin includes a mounting surface connectable to a circuit board through a surface-mount technology to form an electrical connection.

17 Claims, 8 Drawing Sheets

(58) Field of Classification Search
CPC ............... H01L 23/4081; H01L 23/405; H01L 23/4062; H01L 23/4037; H01L 23/4075–4087; H01L 23/52
See application file for complete search history.

(56) References Cited

U.S. PATENT DOCUMENTS

| | | | |
|---|---|---|---|
| 2004/0089931 A1* | 5/2004 | Nakajima | H01L 23/4334 |
| | | | 257/796 |
| 2004/0222515 A1* | 11/2004 | Choi | H01L 23/3735 |
| | | | 257/E23.106 |
| 2005/0224955 A1* | 10/2005 | Desai | H01L 23/433 |
| | | | 257/E23.101 |
| 2010/0025828 A1* | 2/2010 | Sakai | H01L 21/561 |
| | | | 257/E23.116 |
| 2010/0284155 A1 | 11/2010 | Stolze et al. | |
| 2011/0024883 A1* | 2/2011 | Sakai | H01L 21/561 |
| | | | 438/123 |
| 2014/0299979 A1* | 10/2014 | Danno | H01L 24/97 |
| | | | 438/107 |
| 2014/0361424 A1* | 12/2014 | Horio | H01L 23/043 |
| | | | 257/704 |
| 2019/0067154 A1* | 2/2019 | Yoshihara | H01L 23/29 |

FOREIGN PATENT DOCUMENTS

| | | |
|---|---|---|
| JP | 2013118423 A | 6/2013 |
| KR | 20080083533 A | 9/2008 |

\* cited by examiner

POWER DEVICE, POWER DEVICE ASSEMBLY, AND RELATED APPARATUS

CROSS-REFERENCE TO RELATED APPLICATION

This disclosure claims priority to Chinese Patent Application No. 202110184232.7, filed on Feb. 10, 2021, which is hereby incorporated by reference in its entirety.

TECHNICAL FIELD

This disclosure relates to the field of semiconductor technologies, and in particular, to a power device, a power device assembly, and a related apparatus.

BACKGROUND

Power devices, also known as power electronic devices, are mainly used as components in circuits that convert electrical energy. In the packaging of a power device, a wave soldering process is usually used to implement an electrical connection between pins of the power device and a circuit board. However, such a process is relatively complicated. For example, it is required to open component holes on the circuit board and insert the pins into the corresponding component holes, which affects the processing efficiency. Therefore, a surface-mount technology (SMT) is usually used to implement the electrical connection between the pins of the power device and the circuit board.

A power device produces considerable heat during use, and a heat sink needs to be provided for the power device to dissipate heat. However, due to factors such as a tolerance in the size of the power device itself and an assembly tolerance thereof, the heat sink is not in close contact with the power device in the SMT device, causing a higher thermal resistance. Therefore, the heat dissipation efficiency is poor. At present, it is usually required to fasten a circuit board and a heat sink externally, so that the power device can cling to the heat sink, and the power device is sandwiched between the circuit board and the heat sink. However, there are still large voids between the power device and the heat sink. Today, as increasingly stringent heat dissipation requirements are imposed on power devices, how to improve the heat dissipation efficiency has become an urgent problem to be resolved.

SUMMARY

Embodiments of this disclosure provide a power device, a power device assembly, and a related apparatus that can improve the processing efficiency and the heat dissipation efficiency.

According to a first aspect, this disclosure provides a power device, including a plurality of pins and a package body. The package body includes a substrate structure, a semiconductor die, and a molded package, the semiconductor die being on the substrate structure, the substrate structure including a heat dissipation surface connectable to a heat sink, the molded package covering the semiconductor die and the substrate structure excluding the heat dissipation surface, a through hole extending through the substrate structure and the molded package, and the molded package covering an inner wall of the through hole. A first end of each pin is connected to the substrate structure. A second end of each pin and the heat dissipation surface are each uncovered from the molded package, the second end of each pin including a mounting surface connectable to a circuit board.

According to the power device provided in the first aspect of this disclosure, the second end of each pin thereof includes a mounting surface, and the mounting surface is connectable to the circuit board. Because the mounting surface of the power device can be directly connected to the circuit board, steps of opening component holes on the circuit board and inserting the pins into the component holes are omitted, and a processing process is simplified, which can improve the processing efficiency in assembling the power device with the circuit board, and reduce costs.

In addition, the power device is provided with the through hole that extends through the substrate structure and the molded package and is configured to pass through a fastener to connect the circuit board, the power device, and the heat sink. In this way, the power device is directly crimped onto the heat sink, increasing an area of fitting between the heat dissipation surface of the power device and an assembling surface of the heat sink, and reducing voids on an interface between the heat dissipation surface of the power device and the heat sink, thereby reducing thermal resistance of the power device and the power device assembly, and improving heat dissipation efficiency of the power device.

According to the first aspect, in a first possible implementation, the substrate structure includes a first surface and a second surface that are disposed opposite each other, the semiconductor die is disposed on the first surface of the substrate structure, and the heat dissipation surface is disposed on the second surface of the substrate structure. The semiconductor die and the heat dissipation surface are respectively disposed on two opposite surfaces of the substrate structure and do not interfere with each other, facilitating device arrangement.

According to the first aspect or the first possible implementation of the first aspect of this disclosure, in a second possible implementation, the substrate structure includes a metal substrate having a thermally conductive insulation layer and one metal layer that are laminated to one another, and the semiconductor die is disposed on the surface of the metal layer opposed from the thermally conductive insulation layer. The through hole extends through the thermally conductive insulation layer and the metal layer, and the first end of each pin is connected to the metal layer. The metal substrate includes the thermally conductive insulation layer and the metal layer with good thermal conductivity, improving the heat dissipation performance of the power device and improving the reliability of the power device. The metal substrate can optionally be a single-sided metal substrate, which is beneficial to the reduction of the thickness of the power device, thereby reducing the size of the power device.

In a third possible implementation of the first aspect of this disclosure, the substrate structure includes a metal substrate that includes a thermally conductive insulation layer and two metal layers. The thermally conductive insulation layer is sandwiched between the two metal layers, and the semiconductor die is disposed on the side of one of the metal layers opposed from the thermally conductive insulation layer. Because there are two metal layers, that is, the metal substrate is a double-sided metal substrate, the two metal layers can effectively improve the thermal conductivity of the power device, further improving the heat dissipation performance and the reliability of the power device.

In a fourth possible implementation of the first aspect of this disclosure, the substrate structure includes a heat dissipation substrate connected to the surface of the metal substrate opposed from the semiconductor die. The heat dissipation surface is disposed on the surface of the heat dissipation substrate opposed from the metal substrate to enhance the heat dissipation performance of the power device and improve the heat dissipation efficiency of the power device.

In a fifth possible implementation of the first aspect of this disclosure, the heat dissipation surface is disposed on the surface of the metal substrate opposed from the semiconductor die. The heat dissipation surface is directly disposed on the metal substrate, that is, the metal substrate can be directly assembled with the heat sink, which is beneficial to the reduction of the thickness of the power device and the simplification of the structure of the power device.

In a sixth possible implementation of the first aspect of this disclosure, the package body further includes a top portion and a bottom portion that are disposed opposite each other, an orientation of the mounting surface is the same as an orientation of the bottom portion opposed from the top portion, and the heat dissipation surface is disposed on the surface of the top portion opposed from the bottom portion. With the orientation of the heat dissipation surface different from the orientation of the mounting surface, when the power device, the circuit board, and the heat sink are assembled together, the power device can be sandwiched between the circuit board and the heat sink, which improves the flexibility of device arrangement on the circuit board.

In a seventh possible implementation of the first aspect of this disclosure, the package body further includes a top portion and a bottom portion that are disposed opposite each other, an orientation of the mounting surface is the same as an orientation of the bottom portion opposed from the top portion, and the heat dissipation surface is disposed on the surface of the bottom portion opposed from the top portion. The orientation of the heat dissipation surface is the same as the orientation of the mounting surface, and when the power device, the circuit board, and the heat sink are assembled together, the heat sink can pass through the circuit board, which can effectively reduce the thickness of the assembly and enrich forms of the assembly.

In an eighth possible implementation of the first aspect of this disclosure, the heat dissipation surface includes at least two heat dissipation surface units, and a gap between adjacent heat dissipation surface units is filled with the molded package. The heat dissipation surface includes at least two separate heat dissipation surface units, which can effectively reduce a risk that the heat dissipation surface is easily damaged and fractured by force due to its excessively large area. For example, when the substrate structure includes the metal substrate and the heat dissipation substrate, the surface of the heat dissipation substrate opposed from the metal substrate is used as the heat dissipation surface, and the heat dissipation substrate may be divided into two or more independent units to alleviate a risk of fracture of the heat dissipation substrate by a mechanical stress due to its excessively large area. In some implementations, the substrate structure includes the metal substrate but omits the heat dissipation substrate. The surface of the metal substrate opposed from the semiconductor die provides the heat dissipation surface. The surface of the metal substrate opposed from the semiconductor die may be divided into two or more independent units to alleviate a risk that the heat dissipation surface is easily fractured by a mechanical stress due to its excessively large area.

In a ninth possible implementation of the first aspect of this disclosure, the package body includes a top portion, a bottom portion, and side portions. The top portion and the bottom portion are disposed opposite each other, the side portions are connected between the bottom portion and the top portion, and an orientation of the bottom portion is the same as an orientation of the mounting surface. The pin extends in SOP (small outline package), the first end of each pin is connected to the side portion, and the plurality of pins are distributed along the side portions. The package of the power device is flexible in the direction and number of the pins, which facilitates an electrical connection between the power device and the circuit board.

In a tenth possible implementation of the first aspect of this disclosure, the package body includes a top portion, a bottom portion, and side portions. The top portion and the bottom portion are disposed opposite each other, the side portions are connected between the bottom portion and the top portion, and an orientation of the bottom portion is the same as an orientation of the mounting surface. The pin extends in HSOP (small outline package with heat sink), the first end of each pin is connected to the bottom portion, and the plurality of pins are distributed along the side portions. The package of the power device is flexible in the direction and number of the pins, which facilitates an electrical connection between the power device and the circuit board.

In an eleventh possible implementation of the first aspect of this disclosure, the metal substrate includes at least two mounting units. At least two semiconductor dies are provided, and each mounting unit is provided with at least one semiconductor die. The number of mounting units may be set based on a type of the semiconductor die, which improves the flexibility in design of the power device.

According to a second aspect, this disclosure provides a power device assembly, including a power device according to the first aspect or the first to the eleventh possible implementations of the first aspect, a circuit board, a heat sink, and a fastener, where a mounting surface of a second end of a pin of the power device and the circuit board are connected together to form an electrical connection. The circuit board is provided with a cutout extending through the circuit board. The heat sink includes an assembling surface, and the assembling surface is provided with a connecting hole. The fastener passes through the cutout, a through hole of the power device, and the connecting hole, so that a heat dissipation surface of the power device is connected to the assembling surface.

According to the power device assembly provided in the second aspect of this disclosure, because the mounting surface of the power device is directly connected to the circuit board to form the electrical connection, steps of opening component holes on the circuit board and inserting the pins into the component holes are omitted, and a processing process is simplified, which can improve the processing efficiency in assembling the power device with the circuit board, and reduce costs.

In addition, the fastener directly passes through the through hole of the power device and is connected to the heat sink so that the heat dissipation surface is connected to the assembling surface. This increases an area of fitting between the heat dissipation surface of the power device and the assembling surface and reduces voids on an interface between the heat dissipation surface of the power device and the assembling surface, thereby reducing a thermal resistance of the power device and the power device assembly and improving the heat dissipation efficiency of the power device.

Pins of an existing power device and a circuit board are electrically connected by using a wave soldering process. When the power device, the circuit board, and a heat sink are assembled, the power device, the heat sink, and the circuit board are first connected to a fastener, and then the pins of the power device are inserted into corresponding component holes of the circuit board for subsequent soldering. If other electronic devices are required on the circuit board, a surface-mount technology (such as reflow soldering) is usually used to mount them onto the circuit board. As such, when the power device and other electronic devices are disposed on the circuit board, different processes are required, which makes the assembly process complicated. In this disclosure, the pins of the power device are directly connected to the circuit board, and the mounting manner is the same as that of other electronic devices, thereby simplifying the assembly process of the power device assembly and the related apparatus.

According to the second aspect, in a first possible implementation of the second aspect of this disclosure, a package body of the power device further includes a bottom portion and a top portion that are disposed opposite each other. An orientation of the mounting surface is the same as an orientation of the bottom portion opposed from the top portion, the heat dissipation surface is disposed on the surface of the top portion opposed from the bottom portion, the fastener successively passes through the cutout, the through hole, and the connecting hole, and the circuit board, the package body, and the heat sink are laminated to one another. With the orientation of the heat dissipation surface different from the orientation of the mounting surface, when the power device, the circuit board, and the heat sink are assembled together, the power device can be sandwiched between the circuit board and the heat sink, which improves the flexibility of device arrangement on the circuit board. In addition, the heat sink does not need to pass through the circuit board, and a diameter of the cutout of the circuit board does not need to be too large, provided that the fastener can pass therethrough.

In a third possible implementation of the second aspect of this disclosure, the fastener includes a rod and a cap connected to one end of the rod, the rod passes through and is connected to the cutout, the through hole, and the connecting hole. The circuit board is sandwiched between the cap and the surface of the package body opposed from the heat sink, and the cap is disposed on the side of the circuit board opposed from the package body. The cap can effectively prevent the circuit board and the power device from falling off the rod, and improve the reliability of the connection between the circuit board, the power device, and the heat sink, thereby improving the reliability of the power device assembly.

In a fourth possible implementation of the second aspect of this disclosure, a package body further includes a bottom portion and a top portion that are disposed opposite each other. An orientation of the mounting surface is the same as an orientation of the bottom portion opposed from the top portion. The heat dissipation surface is disposed on the surface of the bottom portion opposed from the top portion, with the heat sink passing through the cutout. The fastener successively passes through the through hole and the connecting hole, and the package body and the heat sink are laminated to one another. The heat sink can pass through the circuit board, which is beneficial to the reduction of dimensions of the power device assembly.

With reference to the second and the fourth possible implementations of the second aspect of this disclosure, depending on a position of the heat dissipation surface disposed on the power device, an assembly manner (example) of the power device, the circuit board, and the heat sink may be selected. For example, when the heat dissipation surface is disposed on the surface of the top portion of the power device opposed from the bottom portion of the power device, the pins may be connected to the bottom surface of the circuit board, and the heat sink does not need to pass through the circuit board, that is, the circuit board does not require an open window design corresponding to the heat sink. When the heat dissipation surface is disposed on the surface of the bottom portion of the power device opposed from the top portion, the heat sink may pass through the circuit board, and the pins may be connected to the top surface of the circuit board. In this way, different power devices are packaged together in a variety of forms, which improves the flexibility of device arrangement.

In a fifth possible implementation of the second aspect of this disclosure, the fastener includes a rod and a cap connected to one end of the rod, the rod passing through and is connected to the through hole, the cutout, and the connecting hole. The package body is sandwiched between the cap and the heat dissipation surface. The cap is disposed on the side of the package body opposed from the heat sink, and the cap is disposed on the side of the circuit board opposed from the package body. Positioning of the cap in this manner can effectively prevent the circuit board and the power device from falling off the rod, and improve the reliability of the power device.

In a sixth possible implementation of the second aspect of this disclosure, the power device assembly includes a thermally conductive interface layer that is provided with a mounting hole extending through the thermally conductive interface layer. The thermally conductive interface layer is sandwiched between the heat dissipation surface and the heat sink, and the fastener passes through the mounting hole. The thermally conductive interface layer can improve the efficiency in heat transfer from the power device to the heat sink, thereby improving the heat dissipation efficiency of the power device assembly.

In a seventh possible implementation of the second aspect of this disclosure, the thermally conductive interface layer includes one of a graphite thermal pad, a nano copper hook-and-loop tape, a thermal grease layer, and a thermal gel.

In an eighth possible implementation of the second aspect of this disclosure, the power device assembly is provided with a washer, the washer being encircled on the rod and sandwiched between the cap and the circuit board. Alternatively, the washer can be sandwiched between the cap and the package body. The washer allows for enlarging a stress area of the circuit board and prevents stress on a local area of the circuit board from being excessively large and causing damages to the circuit board.

According to a third aspect, this disclosure provides an electric energy conversion apparatus, including a power device assembly according to the second aspect or the first to the eighth possible implementations of the second aspect of this disclosure.

According to a fourth aspect, this disclosure provides an electric energy conversion device, including an electric energy conversion apparatus according to the third aspect.

According to a fifth aspect, this disclosure provides an assembling method for a power device assembly according to the second aspect or the first to the eighth possible implementations of the second aspect of this disclosure, where the power device assembly includes a power device, a circuit board, and a heat sink, and the power device includes a plurality of pins and a package body. The package body includes a substrate structure, a semiconductor die, and a molded package, the semiconductor die is disposed on the substrate structure, the substrate structure includes a heat dissipation surface, the molded package covers the semiconductor die and the substrate structure excluding the heat dissipation surface, a through hole extends through the substrate structure and the molded package, and the molded package covers an inner wall of the through hole. A first end of each pin is connected to the substrate structure, a second end of each pin and the heat dissipation surface each are uncovered from the molded package, and the second end includes a mounting surface. The heat sink includes an assembling surface provided with a connecting hole. The assembling method includes the following steps: the mounting surface of the pin is connected to the circuit board, and a fastener passes through the through hole, a cutout formed in the circuit board, and the connecting hole so that the heat dissipation surface is connected to the assembling surface.

According to the fifth aspect, in a first possible implementation of the fifth aspect of this disclosure, the package body further includes a bottom portion and a top portion that are disposed opposite each other. An orientation of the mounting surface is the same as an orientation of the bottom portion opposed from the top portion, and the heat dissipation surface is disposed on the surface of the top portion opposed from the bottom portion. A fastener passes through the through hole, the cutout, and the connecting hole includes: the fastener successively passes through the cutout, the through hole, and the connecting hole, so that the circuit board, the package body, and the heat sink are laminated to one another.

In a second possible implementation of the fifth aspect of this disclosure, the fastener includes a rod and a cap connected to one end of the rod. The fastener successively passes through the cutout, the through hole, and the connecting hole so that the circuit board is sandwiched between the cap and the surface of the package body opposed from the heat sink. The cap is disposed on the side of the circuit board opposed from the package body.

In a third possible implementation of the fifth aspect of this disclosure, the package body includes a bottom portion and a top portion that are disposed opposite each other. The orientation of the mounting surface is the same as the orientation of the bottom portion opposed from the top portion. The heat dissipation surface is disposed on the surface of the bottom portion opposed from the top portion. A fastener passes through the through hole, the cutout, and the connecting hole. The heat sink passes through the cutout, and the fastener successively passes through the through hole and the connecting hole so that the package body and the heat sink are laminated to one another.

In a fourth possible implementation of the fifth aspect of this disclosure, the fastener includes a rod and a cap connected to one end of the rod. The fastener passes through the through hole, the cutout, and the connecting hole so that the package body is sandwiched between the cap and the heat dissipation surface, and the cap is disposed on the side of the package body opposed from the heat sink.

In a fifth possible implementation of the fifth aspect of this disclosure, before the mounting surface of the pin is connected to the circuit board, the assembling method includes a thermally conductive interface layer is provided between the heat dissipation surface and the assembling surface, where the thermally conductive interface layer is formed with a mounting hole extending through the thermally conductive interface layer. The fastener passes through the through hole, the cutout, the connecting hole and the mounting hole.

In a sixth possible implementation of the fifth aspect of this disclosure, before the thermally conductive interface layer is provided between the heat dissipation surface and the assembling surface, the assembling method includes providing a film layer on the assembling surface and deoxidizing the film layer. The film layer is a metal layer. Provision of the thermally conductive interface layer includes the nano copper hook-and-loop tape between the heat dissipation surface and the assembling surface, and the interface layer is cured to form the thermally conductive interface layer.

In a sixth possible implementation of the fifth aspect of this disclosure, before the thermally conductive interface layer is provided between the heat dissipation surface and the assembling surface, the assembling method includes providing a graphite thermal pad that is fabricated in advance to form the thermally conductive interface layer.

In a seventh possible implementation of the fifth aspect of this disclosure, before the thermally conductive interface layer is provided between the heat dissipation surface and the assembling surface, the assembling method includes: the coating the assembling surface with a thermal grease or a thermal gel to form the thermally conductive interface layer.

DESCRIPTION OF EMBODIMENTS

Figure 1:
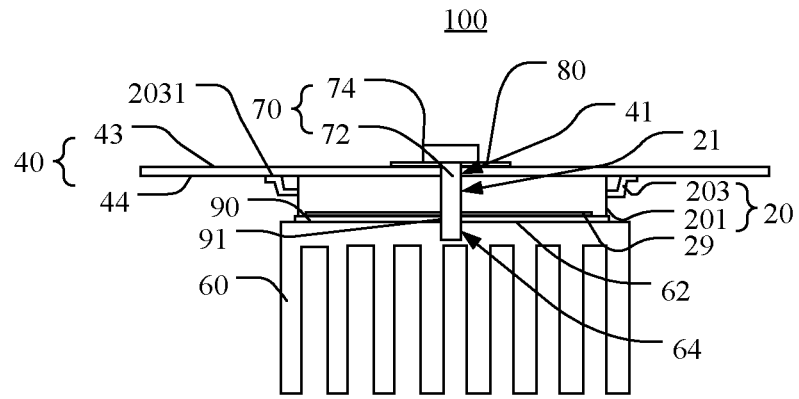
FIG. 1 is a schematic diagram of a structure of a power device assembly according to an embodiment of this disclosure.

At present, many industrial-grade energy products and the like require a large number of densely arranged high-power devices, which generate considerable heat. Therefore, such products need to have a good heat dissipation performance.

In the packaging of a power device, a soldering process is usually used to implement an electrical connection between the power device and a circuit board. One of the commonly used soldering processes is wave soldering. In wave soldering, molten solder (such as lead-tin alloys) is sprayed by an electric pump or an electromagnetic pump into a solder wave as required by the design. The solder wave may also be formed by injecting nitrogen into a solder pool. A circuit board (which may be referred to as a printed circuit board, a printed board, a plug-in board, a wiring board, or the like) pre-loaded with components is passed through the solder wave, implementing soft soldering for mechanical and electrical connections between welding ends or pins (also referred to as prongs) of the components and pads of the circuit board. Wave soldering includes normal wave soldering and selective wave soldering. Regardless of whether it is normal wave soldering or selective wave soldering, component holes are required on the circuit board. When the power device is electrically connected to the circuit board, pins of the power device are first inserted into the component holes. Then, the pins are soldered into the component holes of the circuit board. After the soldering is completed, if the length of the pins in the direction perpendicular to the board surface is too long, the extra length of the pins further needs to be cut off. It can be learned that many steps are required to implement the electrical connection between the power device and the circuit board through soldering, resulting in a low efficiency and high manufacturing costs.

To improve the processing efficiency of a power device assembly and reduce manufacturing costs, SMT (surface-mount technology) may be used to implement an electrical connection between pins of a power device and a circuit board.

The power device is usually equipped with a heat sink to dissipate a lot of heat produced when the power device is in operation. Due to factors such as a tolerance in the size of the power device itself and an assembly tolerance thereof, the heat sink is not in close contact with the power device in the SMT, causing a higher thermal resistance and affecting the heat dissipation efficiency of the assembly. To resolve the problem that the heat sink is not in close contact with the power device, a fastener is usually required to fasten a circuit board and a heat sink, so that the power device is sandwiched between the circuit board and the heat sink, and the power device can cling to the heat sink. However, there are still large voids between the power device and the heat sink, resulting in a large thermal resistance of the power device and the assembly thereof, and it is difficult to meet increasingly stringent heat dissipation requirements on power devices.

This disclosure provides a power device and a corresponding power device assembly (including a heat sink) thereof, which facilitate the reduction of voids on an interface between the power device and the heat sink, thereby improving the heat dissipation efficiency.

The power device and assembly provided in this disclosure can be applied to various electric energy conversion apparatuses that require high-power devices, and the electric energy conversion apparatuses can further be connected to an electric energy conversion device to complete various power functions of the device. For example, the power device assembly of this disclosure can be applied in the field of electric vehicle power systems, that is, the electric energy conversion device may be included in an electric vehicle. The electric energy conversion apparatus may be a motor controller, and the power device may be a power conversion unit assembled in the motor controller. The electric energy conversion apparatus may also be an on-board charger (OBC), and the power device may be an energy conversion unit. The electric energy conversion apparatus may also be a low-voltage control power supply, and the power device may be a DC-DC conversion unit therein, or the like. In addition, the power device assembly of this disclosure is not limited to the field of electric vehicles, but can also be widely used in the field of conventional industrial control, for example, can be applied to an uninterruptible power supply (UPS) in a data center, an inverter of a photovoltaic power generation device, a power supply of a server, and the like.

The following further describes in detail this disclosure with reference to the accompanying drawings.

Referring to FIG. 1, a first implementation provides a power device assembly 100, including a power device 20, a circuit board (printed circuit board, PCB) 40, a heat sink 60, and a fastener 70.

The power device 20 is electrically connected to the circuit board 40, and the power device 20 is sandwiched between the circuit board 40 and the heat sink 60. The heat sink 60 dissipates heat for the power device 20 and the circuit board 40. The heat sink 60 may use a heat dissipation method such as air cooling, water cooling, or the like, which is not limited in this disclosure. The circuit board 40 is a board-level structure used to provide the power device 20, another chip package structure, and the like.

The power device 20 is provided with a through hole 21, and the circuit board 40 is provided with a cutout 41. The heat sink 60 includes an assembling surface 62, and the assembling surface 62 is provided with a connecting hole 64. The fastener 70 passes through the through hole 21, the cutout 41, and the connecting hole 64, so that the power device 20 and the heat sink 60 are connected. Because the fastener 70 directly passes through the power device 20 and crimps the power device 20 onto the heat sink 60, the power device 20 closely fits the heat sink 60, increasing an area of fitting between the power device 20 and the heat sink 60, and effectively reducing voids on an interface between the power device 20 and the heat sink 60, thereby reducing a thermal resistance of the power device 20 and the power device assembly 100, and improving the heat dissipation efficiency of the power device 20 and the power device assembly 100.

The following describes various parts of the foregoing power device assembly 100 in detail.

Figure 2:
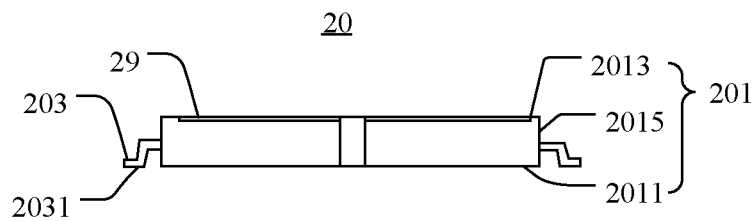
FIG. 2 is a schematic diagram of a structure of a power device in the power device assembly shown in FIG. 1.

Referring to FIG. 1 and FIG. 2, the power device 20 includes a package body 201 and pins 203. The package body 201 includes a bottom portion 2011, a top portion 2013, and side portions 2015. The top portion 2013 and the bottom portion 2011 are disposed opposite each other. The surface of the top portion 2013 opposed from the bottom portion 2011 faces the heat sink 60. The surface of the bottom portion 2011 opposed from the top portion 2013 faces the circuit board 40. In this implementation, the pins 203 may extend in a small outline package (SOP), that is, the pins 203 extend from the side portions 2015 of the package body 201 and have a wing-like structure (for example, an L- or J-shape). A first end of each pin 203 is connected to the side portion 2015, and a second end of each pin 203 protrudes from the side portion 2015. The second end of each pin 203 includes a mounting surface 2031, and the mounting surface 2031 of the pin 203 is connected to the circuit board 40 to form an electrical connection between the power device 20 and the circuit board 40. The mounting surface 2031 is connected to the circuit board 40 through a surface-mount technology (SMT). SMT is a circuit assembly technology in which no-pin or short-lead surface assembly devices are connected to the surface of a circuit board or another substrate, and then soldered and assembled by using methods such as reflow soldering or dip soldering. In this implementation, an orientation of the mounting surface 2031 is the same as an orientation of the bottom portion 2011 opposed from the top portion 2013.

In the power device assembly 100 provided in the first implementation of this disclosure, to form the electrical connection between the power device 20 and the circuit board 40, the mounting surface 2031 is directly connected to the circuit board 40. For example, a reflow soldering process is used in which air or nitrogen is heated to a high enough temperature and then blown to the circuit board onto which the components are already bonded, so that solder on both sides of the components is molten and bonded to the circuit board. There is no need to cut off excessively long pins, which simplifies the steps of assembly between the power device 20 and the circuit board 40, and facilitates reduction of manufacturing costs of the power device assembly 100. In addition, the pins 203 of the power device 20 may be first soldered to the circuit board 40, and then the power device 20 is crimped onto the circuit board 40, which improves the assembling efficiency.

Figure 3:
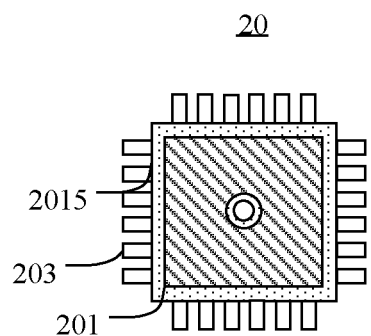
FIG. 3 is a top view of a power device in the power device assembly shown in FIG. 1.

With reference to FIG. 3, from the top view, the package body 201 may be roughly square, that is, there are four side portions 2015. The plurality of pins 203 is distributed along the four side portions 2015 of the package body 201 so that the plurality of pins 203 extend from the four side portions 2015 (that is, toward four directions) of the package body 201. It can be understood that this disclosure does not limit the distribution of the plurality of pins 203 along the four side portions 2015 of the package body 201. In other implementations, the package of the power device 20 may have the pins extending toward at least two directions, that is, the plurality of pins 203 is distributed along at least two side portions 2015 of the package body 201. This disclosure does not limit the shape of the package body 201 either, and the package body 201 may also be of a circular, triangular, polygonal, or irregular shape, or the like.

It can be understood that this disclosure does not limit how the pins 203 extend, either. The pins 203 may be configured based on an internal topology and functional requirements of the power device 20. The pin spacing and shape can be freely allocated on the premise that a distance between the pins 203 meets the requirements. For example, the pins 203 may extend in a heat sink small outline package (small outline package with heat sink, HSOP), and the pins 203 extend from the side portions 2015. The pins 203 extend from the side portions 2015 of the package body 201, so that the package of the power device 20 is flexible in the direction and number of the pins.

Figure 4:
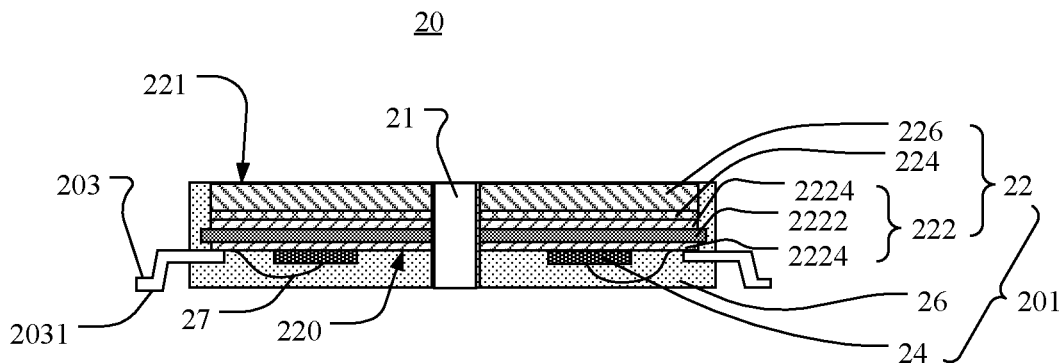
FIG. 4 is a sectional view of a power device in the power device assembly shown in FIG. 1.

Referring to FIG. 4, the package body 201 includes a substrate structure 22, a semiconductor die 24, and a molded package 26. The semiconductor die 24 is disposed on the substrate structure 22, and the substrate structure 22 further includes a heat dissipation surface 29 connectable to the heat sink 60. The molded package 26 covers the semiconductor die 24 and the substrate structure 22 excluding the heat dissipation surface 29. The through hole 21 extends through the substrate structure 22 and the molded package 26, and is configured to pass through the fastener 70. The inner wall of the through hole 21 is covered with the molded package 26 to have insulating properties. The first end of each pin 203 is connected to the substrate structure 22 and the second end of each pin 203 is uncovered from the molded package 26 to form an electrical connection to the circuit board 40. The heat dissipation surface 29 is uncovered from the molded package 26 and is configured to conduct heat produced by the power device 20 to the heat sink 60.

The through hole 21 and an electrical structure (not shown) of the substrate structure 22 are insulated from each other to improve the reliability of the power device 20. FIG. 1 to FIG. 4 only show one through hole 21 as an example. It can be understood that the number of through holes 21 is not limited in this disclosure. In other implementations, there may be two or more through holes 21, and the number of the through holes is set based on different requirements of the power device 20.

The substrate structure 22 includes a first surface 220 and a second surface 221 that are disposed opposite each other. The semiconductor die 24 is disposed on the first surface 220, and the heat dissipation surface 29 is disposed on the second surface 221.

More specifically, the substrate structure 22 includes a metal substrate 222 and a heat dissipation substrate 226 that are laminated. The through hole 21 extends through the metal substrate 222 and the heat dissipation substrate 226. The first surface 220 is the surface of the bottom layer of the metal substrate 222 opposed from the heat dissipation substrate 226. The second surface 221 is the surface of the heat dissipation substrate 226 opposed from the metal substrate 222. The heat dissipation surface 29 is the surface of the heat dissipation substrate 226 opposed from the metal substrate 222, and the molded package 26 covers the metal substrate 222 and the remaining surfaces of the heat dissipation substrate 226 other than the heat dissipation surface 29.

The metal substrate 222 includes a thermally conductive insulation layer 2222 and a metal layer 2224 that are laminated, and the semiconductor die 24 is disposed on the surface of the metal layer 2224 opposed from the thermally conductive insulation layer 2222. The through hole 21 extends through the thermally conductive insulation layer 2222 and the metal layer 2224, and the first end of each pin 203 is connected to the metal layer 2224 provided with the semiconductor die 24.

In this implementation, the metal substrate 222 is a substrate prepared by using a direct bonded copper (DBC) process, that is, the metal layer 2224 is a copper layer. DBC refers to a process in which one or both sides of a ceramic substrate is/are clad with copper, and the copper and a ceramic layer are bonded together at high temperature. The metal substrate 222 may also be prepared by using other processes, for example, a direct plate copper (DPC) process. DPC refers to a method in which a ceramic substrate is plated with a copper layer by vacuum sputtering, and then a development process is used to manufacture electrical circuits. For another example, active metal brazing (AMB) may be used, and AMB refers to a method that relies on active brazing filler metal for high-temperature metallurgical bonding of aluminum nitride and oxygen-free copper. It can be understood that the metal substrate 222 is not limited to a copper-clad ceramic substrate, but may also be a copper-clad metal substrate, or the like. The copper-clad metal substrate uses metal (such as aluminum, copper, iron, or molybdenum) as a substrate that is covered with a thermally conductive insulation layer, and then a copper layer is covered on the side surface of the thermally conductive insulation layer opposed from the metal substrate. It can be understood that the metal layer 2224 is not limited to a copper layer, but may alternatively be another metal layer, for example, a gold layer. The thermally conductive insulation layer 2222 includes aluminum nitride. Alternatively, the thermally conductive insulation layer 2222 may include another insulating material, such as aluminum oxide.

Figure 5:
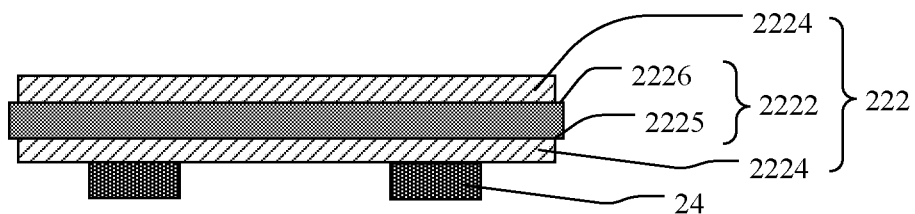
FIG. 5 is a diagram of assembly of a metal substrate and a semiconductor die according to an embodiment of this disclosure.

FIG. 5 is a schematic diagram of a structure in which the metal substrate 222 is clad with copper on both sides, where there are two metal layers 2224. The thermally conductive insulation layer 2222 includes a first surface 2225 and a second surface 2226 that are disposed opposite each other. One metal layer 2224 is connected to the first surface 2225 of the thermally conductive insulation layer 2222, and the other metal layer 2224 is connected to the second surface 2226 of the thermally conductive insulation layer 2222. The semiconductor die 24 is disposed on the side of the metal layer 2224 on the first surface 2225 and opposed from the thermally conductive insulation layer 2222. That is, the two metal layers 2224 are respectively disposed on the two opposite surfaces of the thermally conductive insulation layer 2222. In other words, the metal substrate 222 is a double-sided copper-clad metal substrate, and the through hole 21 extends through the thermally conductive insulation layer 2222 and the metal layers 2224 of the metal substrate 222. The metal layers 2224 are made of a copper material with good thermal conductivity, so that the metal substrate 222 has good thermal conductivity. The double-sided copper-clad metal substrate has two metal layers 2224 so that the thermal conductivity and reliability of the power device 20 are improved.

The heat dissipation substrate 226 is connected to the surface of the metal substrate 222 opposed from the semiconductor die 24. In this implementation, the heat dissipation substrate 226 is connected to the metal layer 2224 that is not provided with the semiconductor die 24 to enhance the heat dissipation performance of the power device 20 and improve the heat dissipation efficiency of the power device 20. In this implementation, the heat dissipation substrate 226 may be connected to the surface of the metal substrate 222 opposed from the semiconductor die 24 by using a bonding layer 224. The bonding layer 224 may be a welding layer. The welding layer has a good bonding performance and thermal conductivity, so that the welding layer can not only firmly connect the heat dissipation substrate 226 and the metal substrate 222, but can also well conduct heat produced by the metal substrate 222 to the heat dissipation substrate 226 for heat dissipation.

Figure 6:
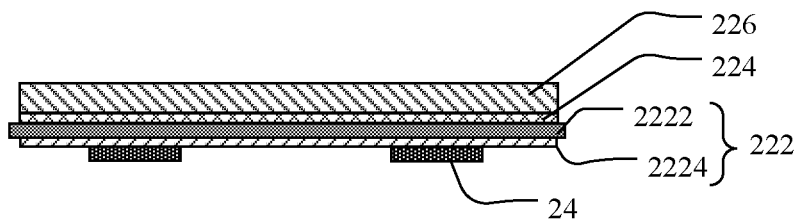
FIG. 6 is a diagram of assembly of a single sided metal substrate, a heat dissipation substrate, and a semiconductor die according to an embodiment of this disclosure.

It can be understood that this disclosure does not limit the metal substrate 222 to be a double-sided metal substrate. In other implementations, there may be one metal layer 2224 in the metal substrate 222, that is, the metal substrate 222 is single-sided. FIG. 6 is a schematic diagram of a structure when the metal substrate 222 is clad with copper on a single side. The heat dissipation substrate 226 is disposed on the side of the thermally conductive insulation layer 2222 opposed from the metal layer 2224.

It can be understood that the bonding layer 224 may alternatively be omitted in the foregoing solution, and the heat dissipation substrate 226 and the metal substrate 222 are directly molded together by using the molded package 26.

The semiconductor die 24 includes electronic components, such as electronic components having a power conversion function: a high-power transistor, a thyristor, a bidirectional thyristor, a metal-oxide-semiconductor field-effect transistor (MOSFET), an insulated gate bipolar transistor (IGBT), a diode, a silicon controlled rectifier (SCR), SiC, GaN, and the like. A connection manner of internal devices of the semiconductor die 24 is not limited. The devices may be connected in series or parallel to form a functional circuit, or the devices may be independent cells.

Figure 7A:
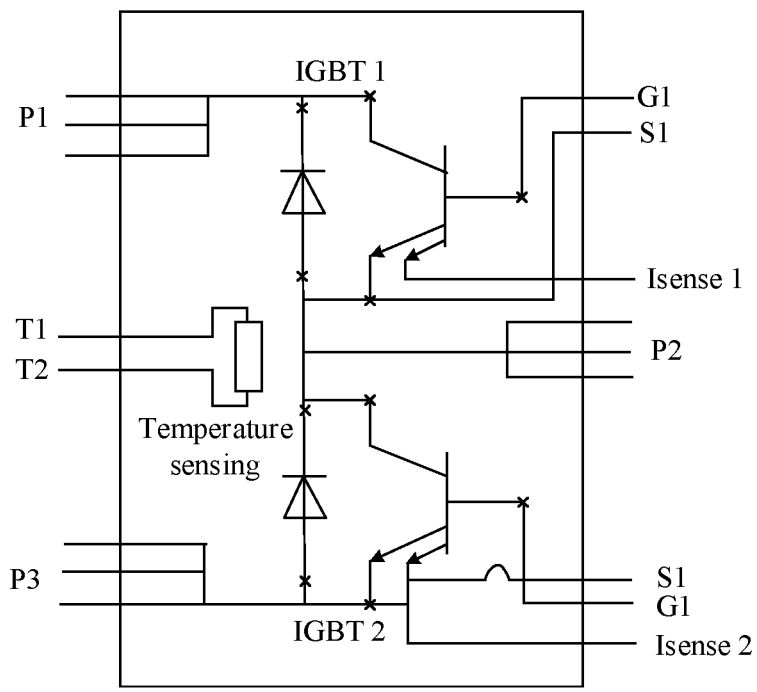
FIG. 7a is a schematic diagram of a half-bridge topology of a semiconductor die with an IGBT electrical symbol according to an embodiment of this disclosure.
Figure 7B:
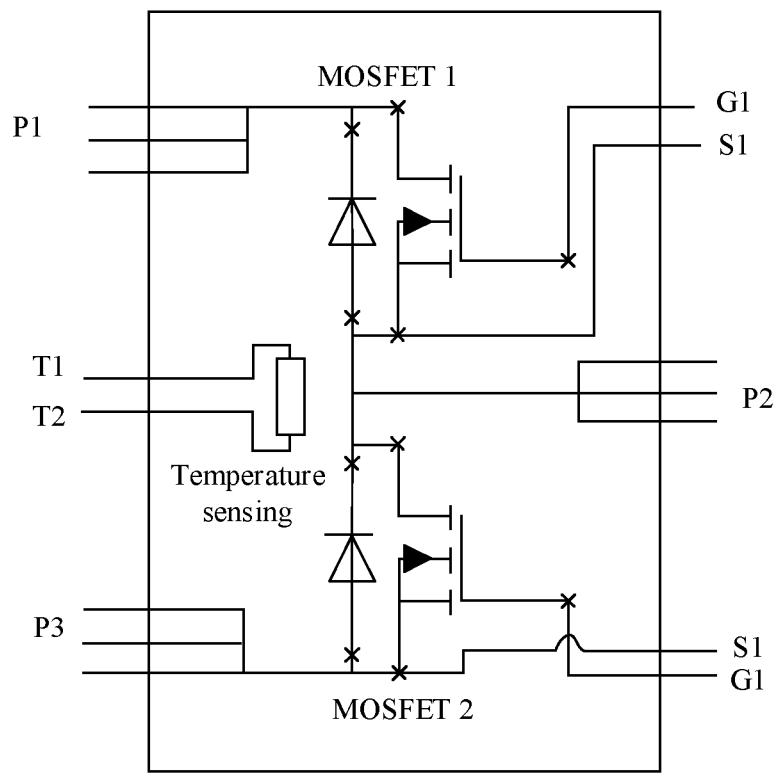
FIG. 7b is a schematic diagram of a half-bridge topology of a semiconductor die with an MOSFET electrical symbol according to an embodiment of this disclosure.

In this way, the number of devices can be effectively reduced, and copper wiring connection forms required for the use of discrete devices on the circuit board can be reduced, optimizing the design of dimensions of the circuit board, thereby reducing the volume of the power device. A topology of the semiconductor die 24 may be single-tube, half-bridge, H-bridge, three-phase full-bridge, three-level, or the like. For example, the semiconductor die 24 includes an IGBT (as shown in FIG. 7a) half-bridge topology and a MOSFET (as shown in FIG. 7b) half-bridge topology. The semiconductor die 24 may further integrate device drive protection control and junction temperature protection. It can be understood that this disclosure does not limit the type, the topological structure, and the number of semiconductor dies 24. The letters in FIG. 7a and FIG. 7b represent symbols of the pins. For example, P1, P2, and P3 refer to power pin numbers, T1 and T2 refer to temperature sampling pin numbers, G1 and S1 refer to switching tube drive pin numbers, Isense1 and Isense2 refer to current sampling pin numbers, and so on, which are not listed herein.

Referring back to FIG. 4, the power device 20 includes a bonding wire 27 disposed on the molded package 26. The bonding wire 27 is connected between the semiconductor die 24 and the metal layer 2224 provided with the semiconductor die 24, and is configured to connect the semiconductor die 24 and an internal electrical structure in the metal substrate 222.

Referring back to FIG. 1, the circuit board 40 includes a top surface (T surface) 43 and a bottom surface (B surface) 44. The cutout 41 extends through the top surface 43 and the bottom surface 44 of the circuit board 40. When the power device 20 is connected to the circuit board 40, the surface of the bottom portion 2011 opposed from the top portion 2013 is disposed facing the circuit board 40, and the heat dissipation surface 29 of the power device 20 is on the side of the top portion 2013 opposed from the circuit board 40. In this implementation, an orientation of the heat dissipation surface 29 is opposite an orientation of the mounting surface 2031, that is, the heat dissipation surface 29 is disposed on the surface of the top portion 2013 opposed from the bottom portion 2011. The mounting surface 2031 of the pin 203 extends from the side to the bottom portion 2011 of the power device 20, and the mounting surface 2031 of the pin 203 is connected to the bottom surface 44 of the circuit board 40.

The fastener 70 passes through the cutout 41, the through hole 21, and the connecting hole 64, so that the power device 20, the circuit board 40, and the heat sink 60 are connected together. Because the power device 20 is provided with the through hole 21, and the fastener 70 passes through the through hole 21 and the connecting hole 64 to directly crimp the power device 20 onto the heat sink 60, the heat dissipation surface 29 of the power device 20 closely fits the assembling surface 62 of the heat sink 60, effectively reducing voids on an interface between the power device 20 and the heat sink 60, thereby reducing a thermal resistance of the power device 20 and the power device assembly 100, and improving the heat dissipation efficiency of the power device 20 and the power device assembly 100.

The fastener 70 includes a rod 72 and a cap 74 connected to one end of the rod 72. The rod 72 passes through and is connected to the cutout 41, the through hole 21, and the connecting hole 64, and the circuit board 40 is sandwiched between the cap 74 and the surface of the package body 201 opposed from the heat sink 60. The cap 74 is disposed on the side of the circuit board 40 opposed from the heat sink 60 to prevent the fastener 70 from falling off the circuit board 40.

This disclosure does not limit a connection manner of the fastener 70 and the heat sink 60. For example, the fastener 70 may be a screw, an outer wall of the rod 72 is provided with a thread, the connecting hole 64 is a screw hole, and the fastener 70 is connected to the connecting hole 64 in a screwed manner. Alternatively, the fastener 70 may be a stud, a pin, a rivet, or the like.

The power device assembly 100 includes a washer 80 encircled on the rod 72. The washer 80 is sandwiched between the cap 74 and the circuit board 40. The cap 74 is disposed on the side of the washer 80 opposed from the circuit board 40. A surface area of the washer 80 is greater than a size of the through hole 21, to enlarge a stressed area of the circuit board 40 and prevent a stress on a local area of the circuit board 40 from being excessively large and causing damages (for example, a risk of fracture) to the circuit board 40. The washer 80 may be integrated with or provided separately from the fastener 70.

The power device assembly 100 includes a thermally conductive interface layer 90, and the thermally conductive interface layer 90 is sandwiched between the power device 20 and the heat sink 60. The thermally conductive interface layer 90 is configured to conduct heat produced by the power device 20 to the heat sink 60 for heat dissipation. The thermally conductive interface layer 90 is formed with a mounting hole 91, and the rod 72 of the fastener 70 also passes through the mounting hole 91.

The thermally conductive interface layer 90 is sandwiched between the heat dissipation surface 29 of the power device 20 and the assembling surface 62 of the heat sink 60. Because the heat dissipation surface 29 of the power devices 20 is in direct contact with the assembling surface 62 of the heat sink 60 through the thermally conductive interface layer 90 for heat dissipation, a heat dissipation path is short, which can effectively improve the heat dissipation efficiency of the power device 20 and the power device assembly 100, thereby improving power density of the power device 20 and the power device assembly 100.

In this implementation, the thermally conductive interface layer 90 includes a nano copper hook-and-loop tape. When the power device assembly 100 is assembled, the assembling surface 62 of the heat sink 60 is coated with a film layer (not shown) and deoxidized. The film layer is a metal layer to improve the degree of fitting between the thermally conductive interface layer 90 and the assembling surface 62. The metal layer may include at least one of nickel, copper, silver, gold, and palladium. It can be understood that the material of the metal layer is not limited in this disclosure. Then, the heat dissipation surface 29 of the power device 20 is deoxidized to improve the degree of fitting between the thermally conductive interface layer 90 and the heat dissipation surface 29. Next, the nano copper hook-and-loop tape is provided between the heat dissipation surface 29 of the power device 20 and the assembling surface 62 of the heat sink 60, and is cured to form the thermally conductive interface layer 90 after a specific time at a specific temperature and pressure (for example, the pressure is 2 MPa, the temperature is 100° C., and the length of time is 10 min). The fastener 70 passes through the cutout 41 of the circuit board 40, the through hole 21, and the mounting hole 91, connectable to the connecting hole 64 of the heat sink 60.

It can be understood that the thermally conductive interface layer 90 is not limited to the nano copper hook-and-loop tape. Alternatively, the thermally conductive interface layer 90 may be made of another material. For example, the thermally conductive interface layer 90 may be a graphite thermal pad, a thermal grease, a thermal gel, or the like.

In an implementation, when the thermally conductive interface layer 90 includes a graphite thermal pad, during preparation, a graphite thermal pad is fabricated in advance to form the thermally conductive interface layer 90 based on the area of the power device 20, and the thermally conductive interface layer 90 is formed with the mounting hole 91. When the power device assembly 100 is assembled, the thermally conductive interface layer 90 is placed between the heat dissipation surface 29 and the heat sink 60, and the fastener 70 passes through the cutout 41 of the circuit board 40, the through hole 21, the mounting hole 91 of the thermally conductive interface layer 90 and is connected to the connecting hole 64 of the heat sink 60.

In an implementation, when the thermally conductive interface layer 90 includes a thermal grease or a thermal gel, during preparation, the assembling surface 62 of the heat sink 60 is coated with the thermal grease or the thermal gel to form the thermally conductive interface layer 90, and then the fastener 70 passes through the cutout 41 of the circuit board 40 and the through hole 21, and is connected to the connecting hole 64 of the heat sink 60.

When the power device assembly 100 is assembled, the circuit board 40 is soldered to the power device 20 and then is placed on the heat sink 60 and positioned, and the fastener 70 passes through the washer 80, the circuit board 40, and the through hole 21 of the package body 201 of the power device 20 to be directly into the connecting hole 64 of the heat sink 60. The fastener 70 applies pressure on the washer 80, and the washer 80 presses the circuit board 40 as a whole to implement close fitting between the heat dissipation surface 29 of the power device 20, the thermally conductive interface layer 90, and the heat sink 60, thereby reducing voids between the assembling surface 62 of the heat sink 60 and the heat dissipation surface 29 of the power device 20, reducing a thermal resistance of the power device 20 and the power device assembly 100, and improving the heat dissipation performance of the power device 20 and the heat dissipation efficiency of the power device assembly 100.

In the power device 20 and the power device assembly 100 provided in this disclosure, the mounting surface 2031 of the pin 203 directly fits the circuit board 40 through the surface-mount technology, implementing an electrical connection between the power device 20 and the circuit board 40. Because there is no need to insert the pins into the component holes of the circuit board, steps of assembling the circuit board 40 with the power device 20 are simplified, and a process of the power device assembly 100 is simplified, thereby improving the processing efficiency of the power device assembly 100 and reducing manufacturing costs of the power device assembly 100.

In addition to the electrical connection between the power device 20 and the circuit board 40 using the surface-mount technology, the power device 20 is provided with the through hole 21 extending through the molded package 26 and the substrate structure 22, so that the fastener 70 can directly pass through the through hole 21 to assemble the power device 20, the circuit board 40, and the heat sink 60 together and directly crimp the power device 20 onto the heat sink 60. In this way, the power device 20 can closely fit the heat sink 60, effectively reducing voids on an interface between the power device 20 and the heat sink 60, thereby reducing a thermal resistance of the power device 20 and the power device assembly 100, and improving the heat dissipation efficiency of the power device 20 and the power device assembly 100.

In addition, the power device 200 uses the surface-mount technology. The pins 203 of the power device 20 may be first connected to the circuit board 40, and then the power device 20 and the heat sink 60 are assembled together. No soldering is required, which helps simplify the assembly process of the power device assembly 100 and the related apparatus.

Figure 8:
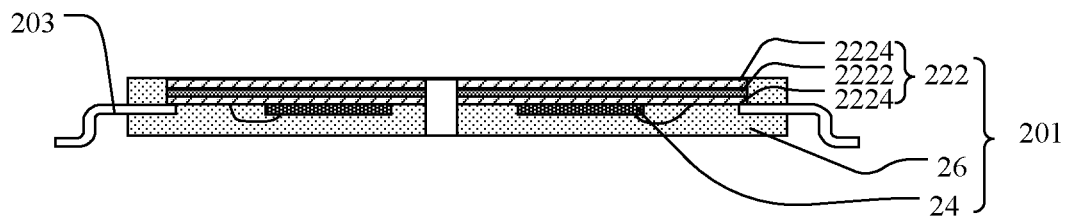
FIG. 8 is a schematic diagram of a structure of another power device according to an embodiment of this disclosure.

Referring now to FIG. 8, a power device 20 is provided in a second implementation that is substantially the same as the power device 20 provided in the first implementation, excluding that a heat dissipation substrate is omitted from a substrate structure. A metal substrate 222 of the substrate structure includes a thermally conductive insulation layer 2222 and two metal layers 2224. The two metal layers 2224 are respectively disposed on two opposite sides of the thermally conductive insulation layer 2222. A semiconductor die 24 is disposed on the side of one metal layer 2224 opposed from the thermally conductive insulation layer 2222. A molded package 26 covers the semiconductor die 24 and the metal substrate 222 excluding a heat dissipation surface to form a package body 201. The side surface of the other metal layer 2224 that is not provided with a semiconductor die 24 and that is opposed from the thermally conductive insulation layer 2222 is used as the heat dissipation surface of the power device 20. In other words, one surface of the metal substrate 222 can be directly used as the heat dissipation surface, that is, the surface of the metal substrate 222 provided with the semiconductor die 24 is a first surface of the substrate structure, and the surface of the metal substrate 222 opposed from the semiconductor die 24 is a second surface of the substrate structure. Pins 203 may extend in SOP.

Figure 9:
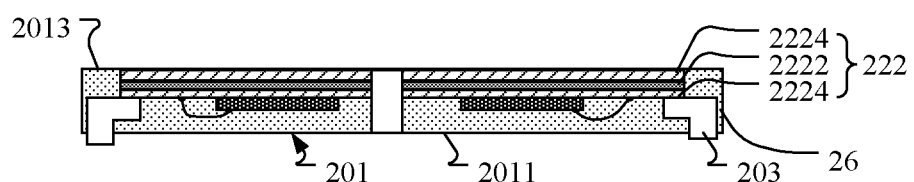
FIG. 9 is a schematic diagram of a structure of another power device according to an embodiment of this disclosure.

Referring to FIG. 9, a power device 20 provided in a third implementation that is substantially the same as the power device 20 provided in the first implementation, excluding that pins 203 may extend in HSOP. A second end of each pin 203 is uncovered from the surface of a bottom portion 2011 of a package body 201 opposed from a top portion 2013, and extends in the stacking direction of a thermally conductive insulation layer 2222 and metal layers 2224 of a metal substrate 222 opposed from the power device 20, and an orthographic projection of the pin 203 along the stacking direction is completely disposed on the metal substrate 222.

Figure 10:
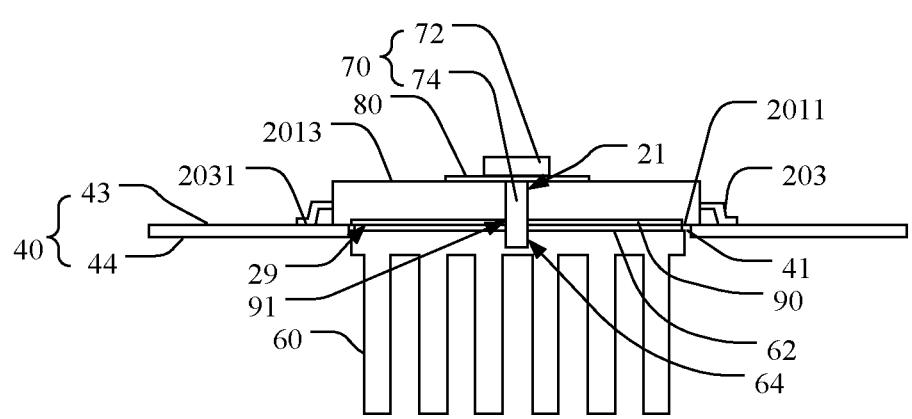
FIG. 10 is a schematic diagram of a structure of another power device assembly according to an embodiment of this disclosure.
Figure 11:
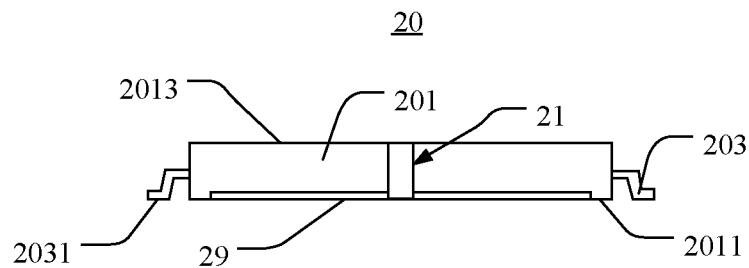
FIG. 11 is a schematic diagram of a structure of another power device according to an embodiment of this disclosure.

Referring to FIG. 10, a power device assembly 100 provided in a fourth implementation that is substantially the same as the power device provided in the first implementation. Compared to FIG. 11, a difference is as follows: an orientation of a mounting surface 2031 of a pin 203 is the same as an orientation of a bottom portion 2011 of a package body 201 opposed from a top portion 2013, and a heat dissipation surface 29 of the power device 20 is disposed on the surface of the bottom portion 2011 of the package body 201 opposed from the top portion 2013. A circuit board 40 is provided with a cutout 41 extending through a top surface 43 and a bottom surface 44, that is, the circuit board 40 has an open window design. A mounting surface 2031 of the pin 203 is connected to the top surface 43 together. A heat sink 60 passes through the cutout 41. A rod 72 of a fastener 70 passes through the through hole 21 and a mounting hole 91 of a thermally conductive interface layer 90, and is directly connected to a connecting hole 64 of the heat sink 60 together. A cap 74 is disposed on the surface of the package body 201 opposed from the heat sink 60, that is, the cap 74 is disposed on the side of the surface of a top portion 2013 opposed from a bottom portion 2011. It can be understood that the heat sink 60 may be provided with a boss passing through the cutout 41 of the circuit board 40, to implement direct-contact heat dissipation between the heat sink 60 and the heat dissipation surface 29 of the power device 20.

In this implementation, the thermally conductive interface layer 90 may also be omitted, the fastener 70 passes through the through hole 21 and is directly connected to the connecting hole 64. The fastener 70 may be a screw, a pin, a rivet, or the like.

With reference to the first and the fourth implementations, depending on a position of the heat dissipation surface disposed on the power device, an assembly manner of the power device, the circuit board, and the heat sink may be selected. For example, when the heat dissipation surface is disposed on the surface of the top portion of the power device opposed from the bottom portion of the power device, the pins may be soldered to the bottom surface of the circuit board by using reflow soldering, and the circuit board does not require an open window design corresponding to the heat sink (that is, the assembly manner exemplified in the first implementation). When the heat dissipation surface is disposed on the surface of the bottom portion of the power device opposed from the top portion of the power device, the circuit board is provided with a cutout, and the pins may be soldered to the top surface of the circuit board by using reflow soldering. In this way, different power devices are packaged together in a variety of forms, which improves the flexibility of device arrangement.

Figure 12:
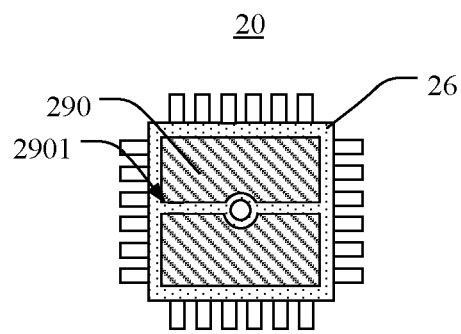
FIG. 12 is a schematic diagram of a structure of another power device according to an embodiment of this disclosure.

Refer to FIG. 12. A power device 20 provided in a fifth implementation of this disclosure differs from the power device 20 provided in the first implementation in that a heat dissipation surface 29 includes two heat dissipation surface units 290, and a gap 2901 between adjacent heat dissipation surface units 290 is filled with a molded package 26. For example, when the surface of a heat dissipation substrate 226 opposed from a metal substrate 222 is used as the heat dissipation surface 29, the heat dissipation substrate may be divided into two independent heat dissipation surface units 290, that is, the heat dissipation surface 29 is divided into two independent heat dissipation surface units 290. It can be understood that the number of heat dissipation surface units 290 is not limited, and there may be two or more heat dissipation surface units 290. That is, the heat dissipation surface 29 includes at least two heat dissipation surface units 290, and a gap 2901 between adjacent heat dissipation surface units 290 is filled with the molded package 26. The heat dissipation surface 29 includes at least two heat dissipation surface units 290, which can effectively reduce a risk that the heat dissipation surface 29 is easily damaged and fractured by force due to its excessively large area. In an implementation, the substrate structure includes the metal substrate but omits the heat dissipation substrate. The surface of the metal substrate opposed from the semiconductor die provides the heat dissipation surface. The surface of the metal substrate opposed from the semiconductor die may be divided into at least two heat dissipation surface units, to alleviate a risk that the heat dissipation surface is easily fractured by a mechanical stress due to its excessively large area.

Figure 13:
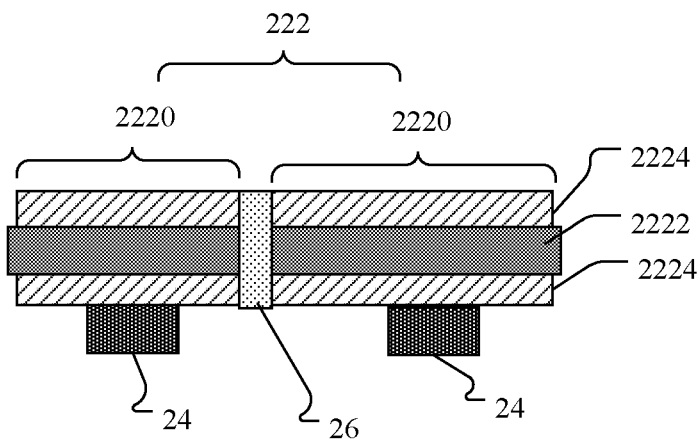
FIG. 13 is a schematic diagram of a structure of another power device according to an embodiment of this disclosure.

Refer to FIG. 13. A power device provided in a sixth implementation of this disclosure differs from the power device provided in the first implementation in that a metal substrate 222 includes two mounting units 2220, a gap is provided between the two mounting units 2220, and the gap may be filled with a molded package 26. In this implementation, in each mounting unit 2220, there are two metal layers 2224, and a thermally conductive insulation layer 2222 is sandwiched between the two metal layers 2224. The surface of one of the metal layers 2224 in each mounting unit 2220 opposed from the thermally conductive insulation layer 2222 is provided with a semiconductor die 24. The adjacent mounting units 2220 are insulated from each other by the molded package 26, which helps improve the reliability of the power device. It can be understood that the number of mounting units 2220 may be set based on a function of the semiconductor die 24 and the like. The metal substrate 222 includes at least two mounting units 2220 and at least two semiconductor dies 24, each mounting unit 2220 being provided with at least one semiconductor die 24.

Figure 14:
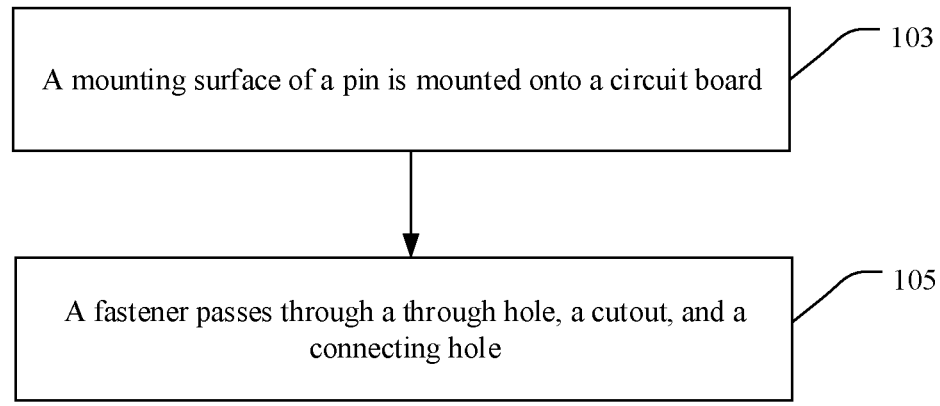
FIG. 14, FIG. 15, FIG. 16, and FIG. 17 are flowcharts of possible assembling methods for a power device assembly according to this disclosure.

This disclosure further provides an assembling method for a power device assembly 100 described above (in the first to the sixth implementations). The power device assembly 100 includes a power device 20, a circuit board 40, and a heat sink 60. The power device 20 includes a package body 201 and a plurality of pins 203. The package body 201 includes a substrate structure 22, a semiconductor die 24, and a molded package 26. The substrate structure 22 includes a heat dissipation surface 29. The molded package 26 covers the semiconductor die 24 and the substrate structure 22 excluding the heat dissipation surface 29. A first end of each pin 203 is connected to the substrate structure 22, a second end of each pin 203 and the heat dissipation surface 29 are uncovered from the molded package 26. The second end of each pin 203 includes a mounting surface 2031. The package body 201 is further provided with a through hole 21 extending through the substrate structure 22 and the molded package 26, and an inner wall of the through hole 21 is covered with the molded package 26. The circuit board 40 is provided with a cutout 41. The heat sink 60 includes an assembling surface 62 provided with a connecting hole 64. Referring to FIG. 14, the assembling method includes the following steps:

Step 103: The mounting surface 2031 of the pin 203 is connected to the circuit board 40. In this implementation, the mounting surface 2031 is connected to the circuit board 40 by using a reflow soldering process.

Step 105: The fastener 70 passes through the through hole 21, the cutout 41, and the connecting hole 64, so that the heat dissipation surface 29 and the assembling surface 62 are connected.

The package body 201 includes a bottom portion 2011 and a top portion 2013 that are disposed opposite each other, an orientation of the mounting surface 2031 is the same as an orientation of the bottom portion 2011 opposed from the top portion 2013, and the heat dissipation surface 29 is disposed on the surface of the top portion 2013 opposed from the bottom portion 2011. The fastener 70 passes through the through hole 21, the cutout 41, and the connecting hole 64 and successively passes through the cutout 41, the through hole 21, and the connecting hole 64 so that the circuit board 40, the package body 201, and the heat sink 60 are laminated to one another.

The fastener 70 includes a rod 72 and a cap 74 connected to one end of the rod 72. The fastener 70 successively passes through the cutout 41, the through hole 21, and the connecting hole 64. The rod 72 passes through the cutout 41, the through hole 21, and the connecting hole 64 so that the circuit board 40 is sandwiched between the cap 74 and the surface of the package body 201 opposed from the heat sink 60, and the cap 74 is disposed on the side of the circuit board 40 opposed from the package body 201.

Before the mounting surface 2031 of the pin 203 of the power device 20 is connected to the circuit board 40, the assembling method further includes: providing a thermally conductive interface layer 90 between the heat dissipation surface 29 and the assembling surface 62, where the thermally conductive interface layer 90 is formed with a mounting hole 91 extending through the thermally conductive interface layer 90. The fastener 70 passes through the through hole 21, the cutout 41, and the connecting hole 64 passes through the mounting hole 91. The thermally conductive interface layer 90 includes one of a nano copper hook-and-loop tape, a graphite thermal pad, a thermal grease layer, or a thermal gel.

In an implementation, an orientation of the mounting surface 2031 is the same as an orientation of the bottom portion 2011 opposed from the top portion 2013, and the heat dissipation surface 29 is disposed on the surface of the bottom portion 2011 opposed from the top portion 2013. The fastener 70 passes through the through hole 21, the cutout 41, and the connecting hole 64 further includes: the heat sink 60 passes through the cutout 41, and the fastener 70 successively passes through the through hole 21 and the connecting hole 64, so that the package body 201 and the heat sink 60 are laminated.

Figure 15:
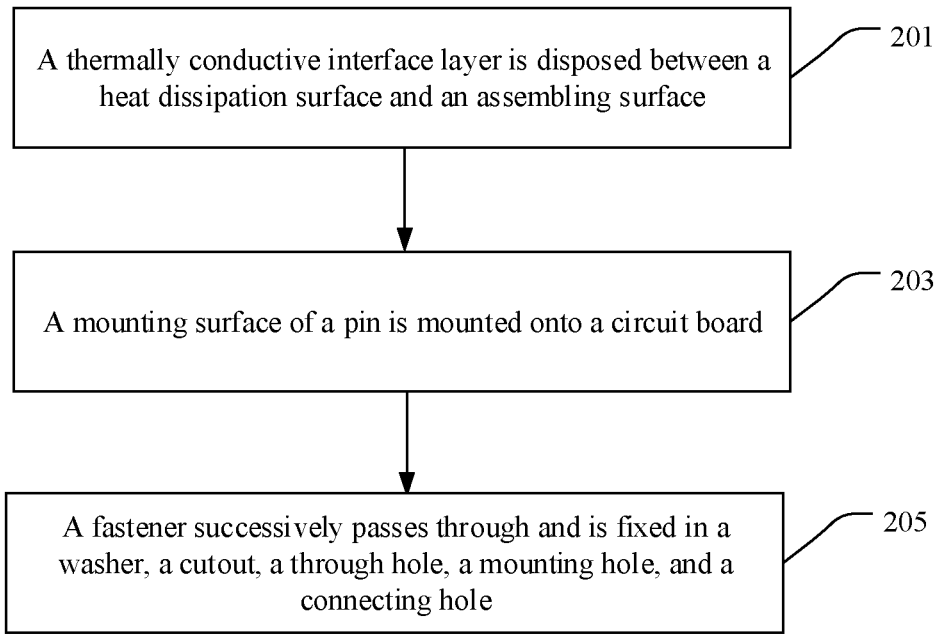

Referring to FIG. 15, another assembling method is described for a power device assembly 100. The assembling method includes the following steps:

Step 201: A thermally conductive interface layer 90 is provided between the heat dissipation surface 29 and the assembling surface 62.

Step 203: The mounting surface 2031 of the pin 203 is connected to the circuit board 40.

Step 205: The fastener 70 passes through and is connected to a washer 80, the cutout 41, the through hole 21, a mounting hole 91, and the connecting hole 64 successively, so that the washer 80, the circuit board 40, the package body 201, the thermally conductive interface layer 90, and the heat sink 60 are laminated to one another. The package body 201 includes a bottom portion 2011 and a top portion 2013 that are disposed opposite each other, an orientation of the mounting surface 2031 is the same as an orientation of the bottom portion 2011 opposed from the top portion 2013, and the heat dissipation surface 29 is disposed on the surface of the top portion 2013 opposed from the bottom portion 2011.

The fastener 70 includes a rod 72 and a cap 74 connected to one end of the rod 72. The diameter of the cutout 41 is adapted to the rod 72. The washer 80 is sandwiched between the circuit board 40 and the cap 74, and the cap 74 is disposed on the side of the washer 80 opposed from the circuit board 40.

In an implementation, the cutout 41 of the circuit board 40 has a relatively large diameter, the heat sink 60 passes through the cutout 41, an orientation of the mounting surface 2031 is the same as an orientation of the bottom portion 2011 opposed from the top portion 2013, and the heat dissipation surface 29 is disposed on the surface of the bottom portion 2011 opposed from the top portion 2013. The washer 80 is sandwiched between the surface of the package body 201 opposed from the heat sink 60 and the cap 74, and the cap 74 is disposed on the side of the washer 80 opposed from the package body 201. The cap 74, the washer 80, the package body 201, the thermally conductive interface layer 90, and the heat sink 60 are laminated to one another.

Figure 16:
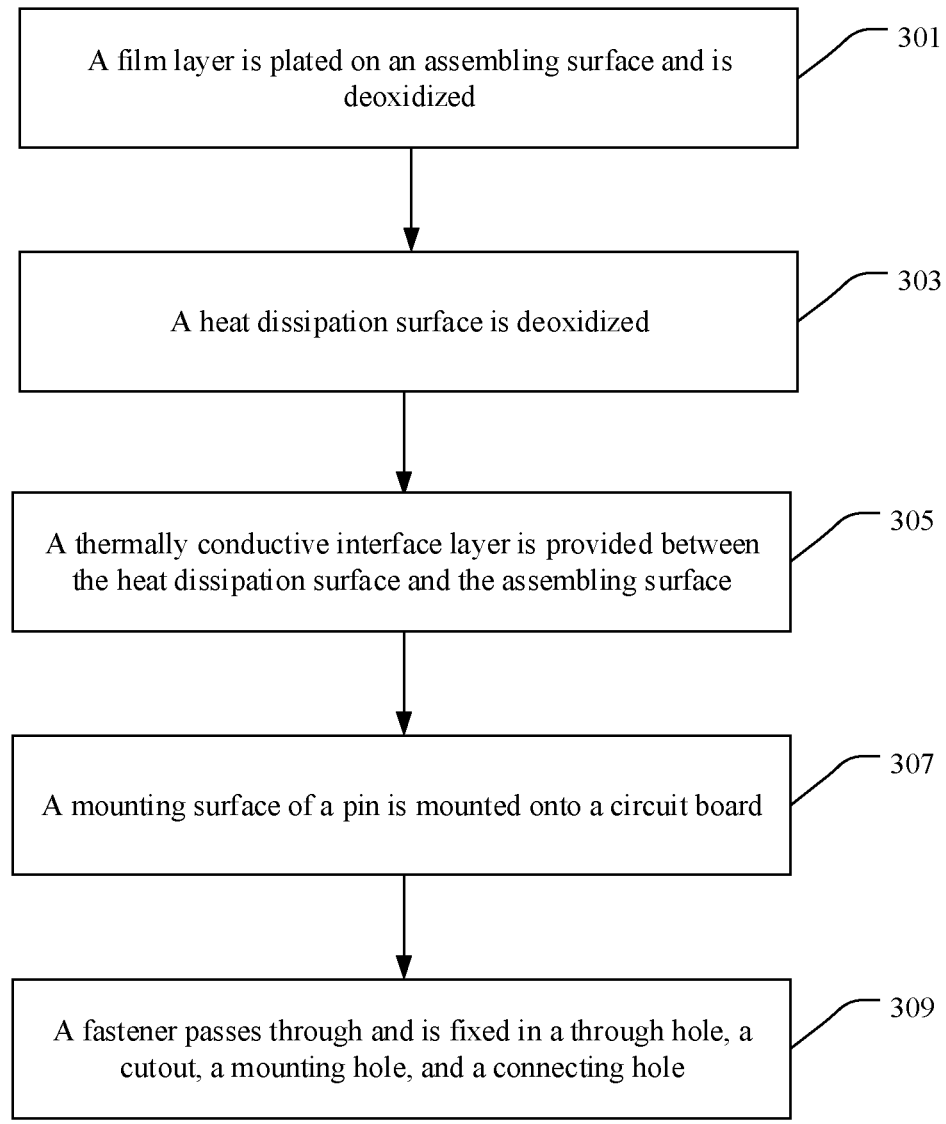

In an implementation, the thermally conductive interface layer 90 includes a nano copper hook-and-loop tape. Referring to FIG. 16, the assembling method for the power device assembly 100 includes the following steps:

Step 301: A film layer is plated on the assembling surface 62 and where the film layer is a metal layer, the film layer is deoxidized. The metal layer includes at least one of nickel, copper, silver, gold, and palladium, and the material of the metal layer is not limited in this implementation of this disclosure.

Step 303: The heat dissipation surface 29 is deoxidized.

Step 305: The thermally conductive interface layer 90 is provided between the heat dissipation surface 29 and the assembling surface 62, which includes: the nano copper hook-and-loop tape is provided between the heat dissipation surface 29 and the assembling surface 62, and is cured to form the thermally conductive interface layer 90, where the thermally conductive interface layer 90 is provided with a mounting hole 91 extending through the thermally conductive interface layer 90.

Step 307: The mounting surface 2031 of the pin 203 is connected to the circuit board 40.

Step 309: The fastener 70 passes through and is connected to the through hole 21, the cutout 41, the mounting hole 91, and the connecting hole 64, so that the power device 20, the circuit board 40, and the heat sink 60 are connected.

Figure 17:
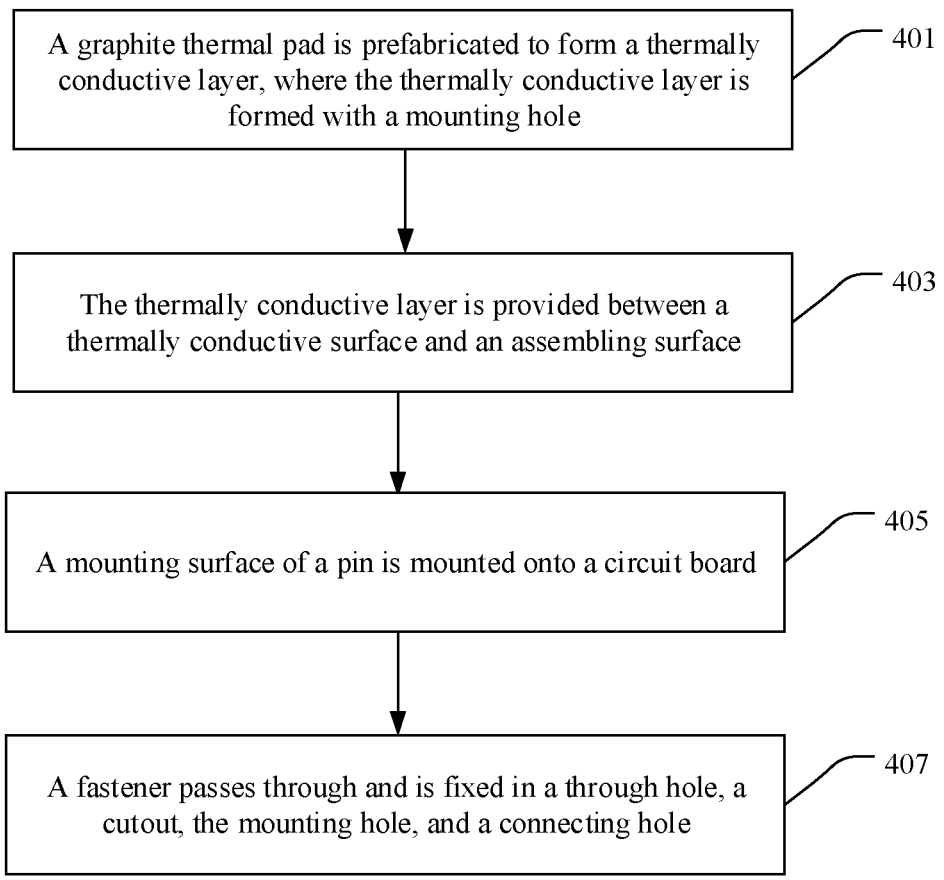

In an implementation, the thermally conductive interface layer includes a graphite thermal pad. Referring to FIG. 17, the assembling method for a power device assembly 100 includes the following steps:

Step 401: The graphite thermal pad is fabricated in advance to form the thermally conductive interface layer 90, where the thermally conductive interface layer 90 is formed with a mounting hole 91 extending through the thermally conductive interface layer 90.

Step 403: The thermally conductive interface layer 90 is provided between the heat dissipation surface 29 and the assembling surface 62.

Step 405: The mounting surface 2031 of the pin 203 is connected to the circuit board 40.

Step 407: The fastener 70 passes through and is connected to the through hole 21, the cutout 41, the mounting hole 91, and the connecting hole 64, so that the power device 20, the circuit board 40, and the heat sink 60 are connected.

In an implementation, that the thermally conductive interface layer 90 is provided between the heat dissipation surface 29 and the assembling surface 62 includes: the assembling surface 62 is coated with a thermal grease or a thermal gel to form the thermally conductive interface layer 90.

It should be understood that the expressions that can be used in this disclosure, such as "include" and "may include", indicate the existence of the disclosed functions, operations, or constituent elements, without limiting one or more additional functions, operations, and constituent elements. In this disclosure, the terms such as "include" and/or "have" can be interpreted as indicating specific characteristics, numbers, operations, constituent elements, components, or combinations thereof, but cannot be interpreted as excluding the existence of one or more other characteristics, numbers, operations, constituent elements, components, or combinations thereof, or a possibility of addition.

In addition, in this disclosure, the expression "and/or" includes any and all combinations of the associated terms listed. For example, the expression "A and/or B" may include A, or may include B, or may include both A and B.

In this disclosure, the expressions including ordinal numbers such as "first" and "second" may modify various elements. However, the elements are not limited by the expressions. For example, the expressions do not limit the order and/or importance of the elements. The expressions are only used to distinguish an element from another element. For example, first user equipment and second user equipment represent different user equipment, although both the first user equipment and the second user equipment are user equipment. Similarly, without departing from the scope of this disclosure, a first element may be referred to as a second element, and similarly, a second element may be referred to as a first element.

When a component is described as "connected to" or "access" another component, it should be understood that the component may be directly connected to or access another component, but still another component may exist between the component and the other component. In addition, when a component is described as "directly connected to" or "directly access" another component, it should be understood that no other component exists between them.

The foregoing descriptions are merely specific implementations of this disclosure, but the protection scope of this disclosure is not limited thereto. Any variation or replacement readily figured out by a person skilled in the art within the technical scope disclosed in this disclosure shall fall within the protection scope of the claims. Therefore, the protection scope of this disclosure shall be subject to the protection scope of the claims.

What is claimed is:

1. A power device, comprising:
a plurality of pins; and
a package body,
the package body comprising a substrate structure, a semiconductor die, and a molded package, the semiconductor die being disposed on the substrate structure, the substrate structure comprising a heat dissipation surface connectable to a heat sink, the molded package covering the semiconductor die and the substrate structure excluding the heat dissipation surface, a through hole extending through the substrate structure and the molded package, and the molded package covering an inner wall of the through hole, the package body further comprising a top portion, a bottom portion and side portions, the top portion and the bottom portion being disposed opposite each other, a surface of the bottom portion away from the top portion being disposed facing a circuit board, the heat dissipation surface being located along the surface of the top portion, the side portions connecting the bottom portion and the top portion; and
a first end of each pin being connected to the substrate structure, a second end of each pin and the heat dissipation surface each being uncovered by the molded package, the second end of each pin comprising a mounting surface connectable to the circuit board in a surface mount manner with the pin mounting surface positioned parallel to the circuit board, the plurality of pins being distributed along the package body side portions, each pin extending from the package body side portions to the package body bottom portion, the mounting surface of each pin extending parallel along one of a bottom surface or a top surface of the circuit board, an orientation of the bottom portion being the same as that of the mounting surface of each pin.

2. The power device according to claim 1, the substrate structure comprising a first surface and a second surface disposed opposite each other, the semiconductor die being disposed on the first surface of the substrate structure, and the heat dissipation surface being disposed on the second surface of the substrate structure.

3. The power device according to claim 2, the substrate structure comprising a metal substrate having a thermally conductive insulation layer and a metal layer laminated to one another, the semiconductor die being disposed on the surface of the metal layer opposed from the thermally conductive insulation layer, the through hole extending through the thermally conductive insulation layer and the metal layer, and the first end of each pin being connected to the metal layer.

4. The power device according to claim 3, the substrate structure comprising a heat dissipation substrate connected to the surface of the metal substrate opposed from the semiconductor die, and the heat dissipation surface being disposed on the surface of the heat dissipation substrate opposed from the metal substrate.

5. The power device according to claim 3, the heat dissipation surface being disposed on the surface of the metal substrate opposed from the semiconductor die.

6. The power device according to claim 2, the substrate structure comprising a metal substrate having a thermally conductive insulation layer and two metal layers, the thermally conductive insulation layer being sandwiched between the two metal layers, and the semiconductor die being disposed on a side of one of the metal layers opposed from the thermally conductive insulation layer.

7. A power device assembly, comprising:
a circuit board;
a heat sink;
a fastener; and
a power device, the power device comprising:
a plurality of pins; and
a package body comprising a substrate structure, a semiconductor die, and a molded package, the semiconductor die being disposed on the substrate structure, the substrate structure comprising a heat dissipation surface connectable to a heat sink, the molded package covering the semiconductor die and the substrate structure excluding the heat dissipation surface, a through hole extending through the substrate structure and the molded package, and the molded package covering an inner wall of the through hole, the package body further comprising a top portion, a bottom portion and side portions, the top portion and the bottom portion being disposed opposite each other, a surface of the bottom portion away from the top portion being disposed facing the circuit board, the heat dissipation surface being located along the surface of the top portion, the side portions connecting the bottom portion and the top portion;
a first end of each pin being connected to the substrate structure, a second end of each pin and the heat dissipation surface each being uncovered by the molded package, the second end comprising a mounting surface connectable to the circuit board in a surface mount manner with the pin mounting surface positioned parallel to the circuit board, the plurality of pins being distributed along the package body side portions, the mounting surface of each pin extending from the package body side portions to the package body bottom portion along one of a bottom surface or a top surface of the circuit board, an orientation of the bottom portion being the same as that of the mounting surface, the mounting surface of the second end of each pin and the circuit board being connected together to form an electrical connection, the heat sink comprising an assembling surface provided with a connecting hole, the fastener passing through each of a cutout formed in the circuit board, a through hole of the power device, and the connecting hole to connect a heat dissipation surface of the power device to the assembling surface.

8. The power device assembly according to claim 7, an orientation of the mounting surface being the same as an orientation of the bottom portion opposed from the top portion, the heat dissipation surface being disposed on a surface of the top portion opposed from the bottom portion, the fastener successively passing through the cutout, the through hole, and the connecting hole, and wherein the circuit board, the package body, and the heat sink are laminated to one another.

9. The power device assembly according to claim 8, the fastener comprising a rod and a cap connected to one end of the rod, the rod passing through and being connected to the cutout, the through hole, and the connecting hole, the circuit board being sandwiched between the cap and a surface of the package body opposed from the heat sink so that the cap is disposed on a side of the circuit board opposed from the package body.

10. The power device assembly according to claim 7, the package body comprising a bottom portion and a top portion having an orientation disposed opposite each other, an orientation of the mounting surface of each pin being the same as the orientation of the package body bottom and top portions, the heat dissipation surface being disposed on a surface of the top portion, the fastener passing through the cutout, the through hole and the connecting hole, and further comprising the package body and the heat sink being laminated to one another.

11. The power device assembly according to claim 10, the fastener comprising a rod and a cap connected to one end of the rod, and the rod passing through and being connected to the through hole, the cutout, and the connecting hole so that the package body is sandwiched between the cap and the heat dissipation surface, the cap being disposed on a side of the package body opposed from the heat sink.

12. The power device assembly according to claim 7, the power device assembly comprising a thermally conductive interface layer provided with a mounting hole extending through the thermally conductive interface layer, the thermally conductive interface layer being sandwiched between the heat dissipation surface and the heat sink, the fastener passing through the mounting hole.

13. The power device assembly according to claim 12, the thermally conductive interface layer comprising one of a graphite thermal pad, a nano copper hook-and-loop tape, a thermal grease layer, and a thermal gel.

14. An electric energy conversion apparatus, comprising:
a power device assembly having a circuit board, a heat sink, a fastener, and a power device, the power device comprising:
a plurality of pins; and
a package body,
the package body comprising a substrate structure, a semiconductor die, and a molded package, the semiconductor die being disposed on the substrate structure, the substrate structure comprising a heat dissipation surface connectable to a heat sink, the molded package covering the semiconductor die and the substrate structure excluding the heat dissipation surface, a through hole extending through the substrate structure and the molded package, the molded package covering an inner wall of the through hole, the package body further comprising a top portion, a bottom portion and side portions, the top portion and the bottom portion being disposed opposite each other, a surface of the bottom portion away from the top portion being disposed facing the circuit board, the heat dissipation surface being located along a surface of the top portion, the side portions connecting the bottom portion and the top portion;

a first end of each pin being connected to the substrate structure, a second end of each pin and the heat dissipation surface being uncovered by the molded package, the second end of each pin comprising a mounting surface connectable to the circuit board in a surface mount manner with the pin mounting surface positioned parallel to the circuit board, the plurality of pins being distributed along the package body side portions, each pin extending from the package body side portions to the package body bottom portion, the mounting surface of each pin extending parallel along one of a bottom surface or a top surface of the circuit board, an orientation of the bottom portion being the same as that of the mounting surface, the mounting surface of the second end of each pin and the circuit board being connected together to form an electrical connection, the heat sink comprising an assembling surface provided with a connecting hole, the fastener passing through each of a cutout formed in the circuit board, a through hole of the power device, and the connecting hole to connect a heat dissipation surface of the power device to the assembling surface.

15. The electric energy conversion apparatus according to claim 14, an orientation of the mounting surface being the same as an orientation of the bottom portion opposed from the top portion, the heat dissipation surface being disposed on a surface of the top portion, the fastener successively passing through the cutout, the through hole, and the connecting hole, and further comprising the circuit board, the package body, and the heat sink being laminated to one another.

16. An electric energy conversion device, comprising:
an electric energy conversion apparatus having a power device assembly,
the power device assembly having a circuit board, a heat sink, a fastener, and a power device,
the power device comprising:
a plurality of pins; and
a package body,
the package body comprising a substrate structure, a semiconductor die, and a molded package, the semiconductor die being disposed on the substrate structure, the substrate structure comprising a heat dissipation surface connectable to a heat sink, the molded package covering the semiconductor die and the substrate structure excluding the heat dissipation surface, a through hole extending through the substrate structure and the molded package, the molded package covering an inner wall of the through hole, the package body further comprising a top portion, a bottom portion and side portions, the top portion and the bottom portion being disposed opposite each other, a surface of the bottom portion away from the top portion being disposed facing the circuit board, the heat dissipation surface being located along the surface of top portion, the side portions connecting the bottom portion and the top portion;
a first end of each pin being connected to the substrate structure, a second end of each pin and the heat dissipation surface each being uncovered from by the molded package, and the second end of each pin comprising a mounting surface connectable to the circuit board in a surface mount manner with the pin mounting surface positioned parallel to the circuit board, the plurality of pins being distributed along the package body side portions, each pin extending from the package body side portions to the package body bottom portion, the mounting surface of each pin extending parallel along one of a bottom surface or a top surface of the circuit board, an orientation of the bottom portion being the same as that of the mounting surface, the mounting surface of the second end of each pin and the circuit board being connected together to form an electrical connection, the heat sink comprising an assembling surface provided with a connecting hole, the fastener passing through each of a cutout formed in the circuit board, a through hole of the power device, and the connecting hole to connect so that a heat dissipation surface of the power device is connected to the assembling surface.

17. The electric energy conversion device according to claim 16, an orientation of the mounting surface being the same as an orientation of the bottom portion opposed from the top portion, the heat dissipation surface being disposed on a surface of the top portion opposed from the bottom portion, the fastener successively passing through the cutout, the through hole, and the connecting hole, and further comprising the circuit board, the package body, and the heat sink being laminated to one another.

* * * * *